United States Patent [19]
Kohno et al.

[11] Patent Number: 5,283,232
[45] Date of Patent: Feb. 1, 1994

[54] METHOD FOR PRODUCING OXIDE SUPERCONDUCTING COMPOSITE WIRE

[75] Inventors: Osamu Kohno; Yoshimitsu Ikeno; Nobuyuki Sadakata; Masaru Sugimoto; Mikio Nakagawa, all of Tokyo, Japan

[73] Assignee: Fujikura Ltd., Tokyo, Japan

[21] Appl. No.: 932,933

[22] Filed: Aug. 20, 1992

Related U.S. Application Data

[60] Division of Ser. No. 831,663, Feb. 6, 1992, Pat. No. 5,168,127, which is a continuation of Ser. No. 170,018, Mar. 18, 1988, abandoned.

[30] Foreign Application Priority Data

| Mar. 20, 1987 | [JP] | Japan | 62-67101 |
| Apr. 28, 1987 | [JP] | Japan | 62-105569 |
| May 21, 1987 | [JP] | Japan | 62-124553 |
| May 23, 1987 | [JP] | Japan | 62-126691 |
| Jul. 6, 1987 | [JP] | Japan | 62-168104 |
| Oct. 16, 1987 | [JP] | Japan | 62-261172 |

[51] Int. Cl.$^5$ .............. H01B 12/10; H01L 39/24
[52] U.S. Cl. ................. 505/1; 505/704; 29/599; 427/62; 427/125; 427/250; 174/125.1; 419/42; 264/313
[58] Field of Search .............. 505/1, 704; 427/62, 427/63, 366, 250, 125, 117, 531; 29/599; 174/125.1; 419/42; 264/313

[56] References Cited

U.S. PATENT DOCUMENTS

| 3,293,008 | 12/1966 | Allen et al. | 427/62 |
| 3,325,590 | 6/1967 | Westervelt et al. | 427/118 |
| 3,691,421 | 9/1972 | Decker et al. | 427/118 |
| 3,996,661 | 12/1976 | Ziegler et al. | 29/599 |
| 4,585,696 | 4/1986 | Dustmann et al. | 428/375 |
| 4,665,611 | 5/1987 | Sadakata et al. | 29/599 |
| 4,863,804 | 9/1989 | Whitlou et al. | 428/555 |
| 4,977,039 | 12/1990 | Onishi et al. | 428/623 |
| 5,100,865 | 3/1992 | Yamamoto et al. | 505/1 |
| 5,168,127 | 12/1992 | Kohno et al. | 505/1 |
| 5,169,831 | 12/1992 | Yamamoto et al. | 505/1 |

FOREIGN PATENT DOCUMENTS

| 301283 | 2/1989 | European Pat. Off. |
| 308326 | 3/1989 | European Pat. Off. |

OTHER PUBLICATIONS

Yamada et al, "Critical current density of wire type $Y-B_a-C_u$-Oxide superconductor", Jpn. J. Appl. Phys. 26(5), May 1987, L865-866.

Matsuda et al, "Superconducting tape-shaped wire by $Y_1Ba_2Cu_3O_{7-\delta}$ with $Jc \approx 2000$ A/cm$^2$", MRS, vol. 99, Nov. 1987, pp. 695-698.

Material Research Society Symposium Proceedings, vol. 99 (1989) pp. 293-296, Sadakata, et al, "Fabrication and Superconducting Properties of High $T_c$ Oxide Wire".

Materials Research Society International Symposium Proceedings, vol. 6 (1989) pp. 169-173, Ikeno, Y. et al, "Characterization and Superconducting Properties of Y-Ba-Cu-O Wire".

Physica B 155 (1989) pp. 164-166, Ikenu, Y. et al, "High Field Properties and Characteristics of Oxide Superconductors".

Physica 148B (1987) pp. 429-431, Kohno, O. et al, "Characteristics of High-$T_c$ Oxide Wire".

Japanese Journal of Applied Physics, vol. 27, No. 1 (1988) pp. L77-L79, Kohno, O. et al, "High Critical Current Density of Y-Ba-Cu Oxide Wire without a Metal Sheath".

Japanese Journal of Applied Physics, vol. 26, No. 5 (1987) pp. L759-L760, Kohno, O. et al, "Critical Temperature and Critical Current Density of La-Sr-Cu Oxide Wires".

IEEE Transactions on Magnetics, vol. 21, No. 2, Mar. 1985, New York US pp. 157-160; Y. Takahashi et al: "Development of 12 T-10 KA Al-stabilized Nb3Sn conductor for TMC-II" *pp. 157-158; FIG. 1*.

Applied Physics Letters, vol. 51, No. 3, Jul. 20, 1987, New York US pp. 203-20.

S. Jin et al: "High Tc superconductors-composite wire fabrication" *the whole document*.

Japanese Journal of Applied Physics, letters vol. 26, No. 10, Oct., 1987.

Tokyo JP pp. 1653-1656; O. Kohno et al: "Critical current density of Y-Ba-Cu oxide wires" *the whole document*.

Business Japan, Jul., 1987, pp. 104-105, "Superconductor Wire Produced by Fujikura Ltd."

*Primary Examiner*—Roy King
*Attorney, Agent, or Firm*—Oblon, Spivak, McClelland, Maier & Neustadt

[57] ABSTRACT

A method for producing an oxide superconducting composite wire is disclosed, which comprises the steps of: (a) molding a powdered oxide superconductor material to form a wire; (b) heat treating the wire in an oxygen atmosphere thereby forming the wire into an oxide superconducting member; (c) forming a non-oxidizing metal intermediate layer on a surface of the oxide superconducting member; (d) bundling a plurality of the oxide superconducting members containing the intermediate layer; (e) inserting the bundled oxide superconducting members into an oxidizing metal support tube; and (f) drawing the product of step (e) to reduce its diameter and heat-treating it.

11 Claims, 2 Drawing Sheets

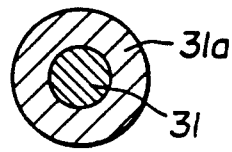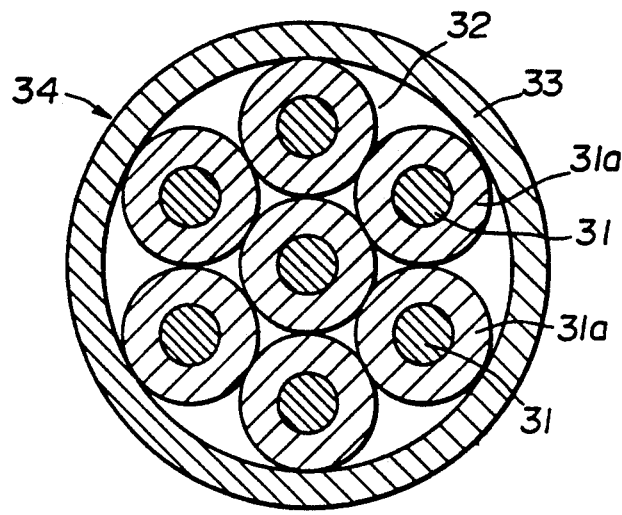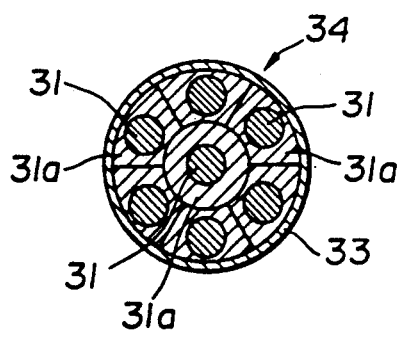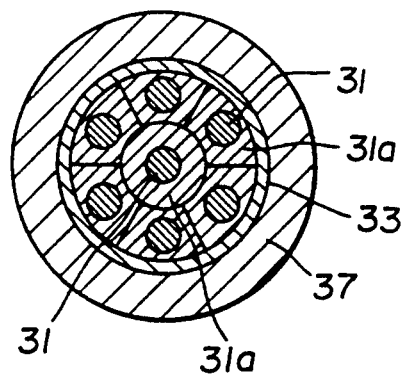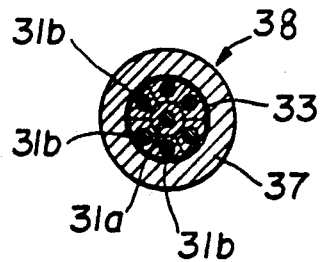

METHOD FOR PRODUCING OXIDE SUPERCONDUCTING COMPOSITE WIRE

This is a division of application Ser. No. 07/831,663, filed on Feb. 6, 1992 now U.S. Pat. No. 5,168,127, which is a continuation of Ser. No. 07/170,018, filed Mar. 18, 1988, now abandoned.

FIELD OF THE INVENTION

The present invention relates, though not exclusively, to a method of producing an oxide superconducting wire which may be used in, for example, a power-transmission cable or a superconducting magnet coil, and the oxide superconducting wire produced by this method. In this specification, the term "superconducting wire" means a superconducting wire, superconducting tape or wire having a similar shape.

BACKGROUND OF THE INVENTION

In recent times, various oxide superconductors have increasingly been discovered which show very high values of the critical temperature (Tc) at which the transition from a normal conductive sate to a superconductive state takes place. Since such an oxide superconductor shows a higher critical temperature than conventional alloy or intermetallic compound superconductors, it is considered that oxide superconductors will highly promise for practical superconducting materials.

However, this sort of superconductor is made of ceramics and is thus very brittle, cracks being easily produced. We have attempted the production of various superconducting wires each comprising an oxide superconductor as the conducting portion, in which a metal sheath was charged with an oxide superconducting material in a powder form, and the oxide superconductor charged metal sheath was then subjected to diameter reduction and then to heat treatment.

In the above-described method, however, the oxide superconducting material powder is contact with the metal sheath which contains an oxidizing metal such as copper, a copper alloy, or stainless steel, during the heat treatment, in which this oxidizing metal takes oxygen away from the superconducting material and is oxidized. As a result, the contact portions between the superconducting material powder and the oxidizing metal lacks oxygen. Consequently, a problem occurs in reductions both in the critical temperature and in the critical current density of the product superconductor.

SUMMARY OF THE INVENTION

Therefore, it is an object of the present invention to provide a method of producing an oxide superconductor, as well as the oxide superconductor produced by this method which is capable of reinforcing and protecting the superconductor portion without producing any loss of performance of the superconductor produced, particularly with respect to both the critical temperature and critical current density.

One aspect of the present invention is directed to a method of producing an oxide superconducting wire in which a non-oxidizing metal layer is formed between an oxide superconducting material and an oxidizing metal support in order to prevent oxygen from being taken away from the oxide superconducting material by the oxidizing metal for a subsequent heat treatment, thereby producing a superconducting material, which is then heated in order to form an oxide superconductor.

Another aspect of the present invention is directed to an oxide superconductor produced by the above-described method.

DETAILED DESCRIPTION AND PREFERRED EMBODIMENTS OF THE INVENTION

In the present invention, the term "oxide superconducting material" means a material containing elements comprising an oxide superconductor, and it contains, for example, alkali earth metal elements, elements in Group IIIa of the Periodic Table, and copper oxides. Alkali earth metal elements may include Be, Sr, Mg, Ca, Ba, and Ra. Such alkali earth metal elements may be employed in the form of a powder of a compound such as a carbonate, oxide, chloride, sulfide, or fluoride, or an alloy powder.

The elements in Group IIIa of the Periodic Table may include, according to the present invention, Sc, Y, La, Ce, Pr, Nd, Pm, Sm, Eu, Gd, Tb, Dy, Ho, Er, Tm, Yb and Lu. Such elements in Group IIIa of the Periodic Table may be employed in the form of a powder of a compound such as a carbonate, oxide, chloride, sulfide, or fluoride, or an alloy powder.

The copper oxide according to the present invention may include $CuO$, $Cu_2O$, $Cu_2O_3$ and $Cu_4O$ which may used in the form of a powder.

When the oxide superconductor of the present invention is typically expressed by the following formula $$A_xB_yCu_zO_{9-\delta}$$

wherein A denotes an element in Group IIIa of the Periodic Table and B denotes an alkali earth metal element, x, y, z and δ are typically within the range of $0.1 \leq x \leq 2.0$, $1 \leq y \leq 3$, $1 \leq z \leq 3$, and $0 \leq \delta \leq 7$, respectively. In a Y-Ba-Cu-O system, it should be an orthorhombic system and it is typically that $x=1$, $y=2$, $x=3$, and $2<\delta 21\ 3$, preferably $\delta=$ about 2. In a $(La_{2-x}M_x)CuO_4$ system, typically $0<x<0.3$ and preferably $x=0.15$ wherein M may include Be, Sr, Mg, Ca, Ba or Ra.

When a powder of a superconducting material is prepared, a material containing one or more of the above-described alkali earth metal elements and elements in Group IIIa of the Periodic Table may be selected in the present invention. For example, superconductor raw materials for a La-Sr-Cu-O, Y-Ba-Cu-O, La-Yb-Ba-Cu-O or La-Yb-Ba-Sr-Cu-O system may be prepared.

In addition, when a powder of a superconducting material contains a carbonate or carbon content, this material powder may be preliminarily calcined in order to thermally decompose the carbonate or carbon content in the powder so as to deposit it as a carbide on the inner surface of a sheath material. This preliminary calcination is preferably performed under such conditions that the temperature is lower than the heating temperature at which an oxide superconductor is produced, typically about 500° C. to 900° C., preferably about 650° C. to 750° C., and for a time of about 1 to 10 hours. If an analysis performed after the preliminary calcination shows that the carbonate or carbon content remains in the powder, the powder is again subjected to preliminary calcination. The preliminary calcination prevents deterioration in the processing property of a superconducting material due to the presence of carbon and reduces such troubles as breaking of a wire during the diameter reduction. Thus, wires or strips having a fairly large length can be easily obtained.

After the carbon content in the superconducting material powder has been sufficiently removed by the above-described method, the superconducting material powder may be preferably subjected to temporary calcination. The temporary calcination is performed under such conditions as a temperature of, typically about 500° C. to about 950° C., preferably about 850° C. to about 950° C., and a time of about 1 hour to about 30 hours. The temporary calcination partially produces reactions between the oxide of the alkali metal element, the oxide of the element in Group IIIa of the Periodic Table, and the copper oxide contained in the powder, so that at least part of the powder is changed into an oxide exhibiting superconductivity.

After the thus-obtained powder material has been ground well so that the particle sizes are made uniform, it may be used in the present invention in the processing of an oxide superconducting material.

The elongated support of the oxidizing metal in the present invention may be made of Cu, Cu alloys, high-melting point metals such as Ta, Nb and Mo and stainless steel. This support may be according to the present invention employed for the purpose of facilitating the processing of a superconducting wire and also for achieving the protection and/or reinforcement of a superconductor.

In the present invention, materials that are used for the non-oxidizing metal layer, interposed between the oxide superconducting material and the oxidizing metal support, may include noble metals such as Ag, Au, Pt, Ru, Rh, Pd, Os and Ir and noble metal alloys such as Ag alloys and Au alloys. The non-oxidizing metal layer may be formed on the inner surface and/or the outer surface of the oxidizing metal support, which surface is in contact with the superconducting oxide material, by means of a conventional surface treatment method such as a plating method, a film-forming technique such as a chemical vapor deposition (CVD), vapor deposition, sputtering or dipping method, or a method of winding a noble metal tape or cladding a noble metal pipe around it, before the superconducting oxide material and the oxidizing metal support are put together. The non-oxidizing metal layer may also be formed on the outer surface of a molded product formed of the superconducting oxide material by any of the above-described various methods, and the oxidizing metal support is then placed around the molded product through the non-oxidizing metal layer. The non-oxidizing metal layer, formed between the superconducting oxide material and the oxidizing metal support by the above-described method, is then subjected to heat treatment in a flow of oxygen gas at the diffusion temperature, typically about 700° C. to about 1100° C., preferably about 800° C. to about 1100° C., for a time of about 1 to 300 hours, preferably about 1 to 100 hours.

Although the rate of temperature rise from room temperature to the above-described calcination temperature may be according to the present invention larger than about 500° C./hour, it is typically 200° C./hour or less, preferably about 50° to 100° C./hour. At a rate of temperature rise smaller than about 200° C./hour, an excellent effect of preventing cracks due to thermal stress is obtained. On the other hand, the rate of temperature decrease from the calcination temperature to room temperature is usually smaller than about 200° C./hour, typically smaller than about 100° C./hour and is preferably about 20° to 50° C./hour. At a rate of temperature decrease over about 200° C./hour, cracks due to thermal stress may not be sufficiently prevented from occuring.

when the calcined material is cooled, it may be according to the present invention maintained for a given time in the temperature range in which the crystal form of the oxide superconductor transforms from a cubic system to a rhombic system, and it may be then cooled to room temperature so that the crystal structure is transformed to a rhombic system having superconductivity, whereby an oxide superconductor having a high critical temperature and high critical current density is provided. In the Y-Ba-Cu-O system, the crystal structure is transformed to a rhombic system by maintaining the oxide superconductor typically within the temperature range of about 400° C. to about 500° C. for about 5 to about 48 hours.

BRIEF DESCRIPTION OF THE DRAWING

FIG. 4 is a schematic sectional view of a composite element which is used in another embodiment of the present invention and comprises a molded product and a non-oxidizing metal layer provided thereon;

FIG. 5 is a schematic sectional view of a composite element assembly which is formed by covering the composite elements shown in FIG. 4 with an oxidizing metal pipe;

FIG. 6 is a schematic sectional view of an assembly with a reduced diameter which is obtained by subjecting the assembly shown in FIG. 5 to a process for reducing the diameter;

FIG. 7 is a schematic sectional view of an element wire formed by covering the assembly with a reduced diameter shown in FIG. 6 with a tube of stabilizing material; and FIG. 8 is a schematic sectional view of an element wire having a reduced diameter which is obtained by subjecting the element wire shown in FIG. 7 to a process for reducing the diameter.

The present invention is described below on the basis of certain embodiments with reference to the accompanying drawings, but the present invention is not limited to these embodiments.

Figure 1:
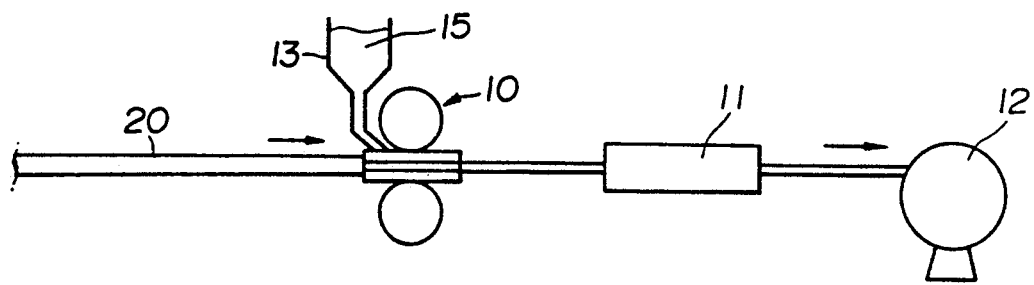
FIG. 1 is a schematic drawing of an embodiment of the present invention.

FIG. 1 is a schematic diagram of an apparatus for performing a method of the present invention. In FIG. 1, reference numeral 10 denotes a four-direction roll; reference numeral 11, an induction heater; and reference numeral 12, a winding machine. All these devices are conventional ones. A hopper 13 is provided at one side end of the four-direction roll 10.

A discharge portion at the lower end of the hopper 13 is placed near the roll portion of the four-direction roll 10 so as to be able to supply a powder 15 of the superconducting oxide material which is received in the hopper 13 onto the periphery of a wire passing through the roll portion.

The powder material 15 is a mixed powder obtained by mixing at a given ration powders of one or more elements of the above-described elements in Group IIIa of the Periodic Table or of one or more compounds of the elements in Group IIIa (for example, oxide powders, chloride powders, or carbonate powders), powders of one or more elements of the above-described alkali earth metal elements or one or more compounds of those alkali metal earth elements, and a powder of a copper oxide such as CuO in a given ratio, or a calcined powder obtained by heating such a mixed powder at about 500° C. to 700° C. The powder material 15 may also be a mixture, comprising a previously produced superconducting oxide powder, mixed with the above-described powder.

When a method of the present invention is performed by using the apparatus shown in FIG. 1 to produce a superconducting wire, a reinforcing core material rod 20, which serves as an oxidizing metal support and comprises Cu or a Cu alloy, a high-melting point metal such as Ta, Nb, or Mo, or stainless steel, is prepared, and a non-oxidizing layer 21, comprising a noble metal such as Ag, Au, Pt, Ru, Rh, Pd, Os, or Ir or an Ag or Au alloy, is formed on the surface of the core rod 20 by a surface treatment method such as a plating method. The non-oxidizing layer 21 may be formed by a film-forming method such as a CVD, vapor deposition or sputtering method, or a method of winding a noble metal tape or cladding a noble metal pipe, as described above.

The support 20, which is an elongated reinforcing core material having a non-oxidizing layer 21 formed thereon, is sent to the four-direction roll 10, and the powder material 15 is supplied from the hopper 13 to the periphery of the non-oxidizing layer 21 and press-bonded thereto by the four-direction roll 10 to produce a superconducting element wire or a composite wire in which a pressed powder layer 22 is formed on the outside of the non-oxidizing layer 21.

The thus-obtained element wire is sent to a known induction heater 11 in which an oxidizing atmosphere can be maintained so that the wire passing therethrough can be heated in the oxidizing atmosphere. In the induction heater 11, the pressed powder layer 22 is subjected to heat treatment in the oxidizing atmosphere at a temperature of about 700° C. to about 1100° c. for about 1 to 100 hours so that a superconducting layer is formed in the pressed powder layer to form a superconducting wire. In this heat treatment, since the non-oxidizing layer 21 is interposed between the oxidizing metal support 20 and the powder material 15 of the superconductor, the oxygen contained in the powder material 15 is not absorbed by the oxidizing metal support 20 and elements in the powder material 15 are hence reacted at a given component ratio to produce the superconducting layer.

After the heat treatment has been conducted for a given time, the superconducting wire produced is wound up by the winding machine 12.

In the thus produced superconducting wire, the oxidizing metal support 20 is covered with the non-oxidizing layer 21 so that the oxygen contained in the powder material adequately contributes to the production of a superconducting substance, whereby a sufficient amount of a superconducting layer for use in a desired application can be produced. It is therefore possible to obtain a long superconducting wire having a relatively high critical current density and a stable quality. In addition, the pressed powder layer 22 on the outside of the oxidizing metal support 20 is exposed to the air and thus oxygen is uniformly supplied over the entire length of the layer during the heat treatment in the induction heater 11 so that a uniform superconducting layer can be efficiently produced.

The superconducting wire of this embodiment has the metal support 20 and the superconducting layer produced on the exterior thereof and thus can be directly connected to other conductors.

Alternatively, a tubular support can also be used in place of the solid support 20. If a tubular support is used and a superconducting layer is produced on the inner and/or outer periphery of the support to produce a superconducting wire, a refrigerant is allowed to flow through the support so as to cool the superconductor from the inside thereof.

Figure 2:
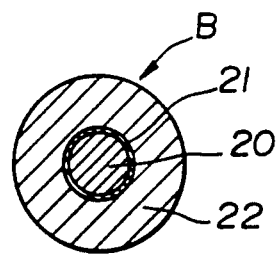
FIG. 2 is a schematic sectional view of a superconducting wire element produced by the method shown in FIG. 1.
Figure 3:
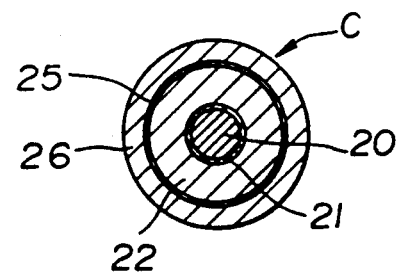
FIG. 3 is a schematic sectional view of a modification of the superconducting wire element shown in FIG. 2.

FIG. 3 shows a modification of the superconducting wire shown in FIG. 2. A superconducting wire C has a structure in which the above-described superconducting wire B is covered with an oxidizing metal tube 26, which also serves as a stabilizing material, with a non-oxidizing metal layer 25 interposed therebetween. The tube 26 is made of the same material as that of the support 20 of the above-described superconducting wire B, and the non-oxidizing metal layer 25 is made of the same material as that of the non-oxidizing metal layer 21 of the superconducting wire B.

The superconducting wire C having the above-described structure can be produced by the method described below. A core material 20 having the non-oxidizing metal layer 21 formed in its periphery and the tube 26 having the non-oxidizing metal layer 25 formed in its internal periphery are prepared, the core material 20 having the non-oxidizing metal layer 21 is concentrically inserted into the tube 26, and a powder material is charged between the non-oxidizing metal layer 21 and the tube 26. These materials are then subjected to the process of reducing the diameter then to the heat treatment so as to change the powder material into a superconductor. Since the non-oxidizing metal layers 21 and 25 are formed in the outer periphery of the core material 20 and the inner periphery of the tube 26, respectively, there is no danger that the oxygen contained in the powder material will be taken away by the core material 20 and the tube 26 during the heat treatment, thus ensuring that a sufficient amount of superconducting layer is produced.

A superconducting wire can also be produced by providing the non-oxidizing metal layer 25 in the inner periphery of the tube 26, charging only the superconductor material in the tube, and then heating these materials.

FIGS. 4 to 8 show a second embodiment of the present invention. In this embodiment, a raw material from which the carbon content has been removed and which has been temporarily calcined under the same conditions as those described above is ground well so that the particle size is made uniform. The particle size is typically smaller than about 5 $\mu$m, preferably about 0.5 $\mu$m to about 3 $\mu$m. The raw material having a uniform particle size is charged in a mold, such as a rubber mold, having a space of desired shape, and is then pressed by applying hydraulic pressure such as hydrostatic pressure so as to be suitably molded to obtain a molded product of any desired shape such as a cylindrical or other forms such as a disc-like form. FIG. 4 shows a cylindrical molded product 31. The rubber mold used in the molding is preferably made of a flexible material such as natural rubber or a synthetic rubber. A known hydrostatic press such as a cold hydrostatic press can be used as the press. The molding pressure of a hydraulic press depends upon the composition and compositional ratio of the powder material and the size of the molded product, but is typically within the range of from about 1.5 to about 10 ton/cm$^2$, preferably from about 1500 to about 3500 kg/cm$^2$.

The above-described molded product is then subjected to the heat treatment which is performed in a flow of oxygen under such typical conditions as a temperature of about 800° C. to 1100° C. and a time of about 1 to 300 hours. This heat treatment causes the oxides of the alkali earth metal elements and the elements in Group IIIa of the Periodic Table to react well with the copper oxide in the molded product 31, the whole of which is thus changed into an oxide superconductor of, for example, a layer perovskite form.

The molded product 31 is then coated with a non-oxidizing metal layer 31a to form a composite element. The non-oxidizing metal layer 31a can be made of the same material as the non-oxidizing metal layer 21 in accordance with any one of the above-described surface treatment methods.

A plurality of the thus-formed composite elements are assembled to form the composite element assembly 32 shown in FIG. 5, which is then covered with an oxidizing metal tube 33 made of a material that is harder than the material used in the above-described non-oxidizing metal layer 31a to form a composite element assembly 34 with a sheath. The difference in Vickers hardness between the metal tube 33 and the metal layer 31a is preferably from Hv=about 20 to about 200. The composite element assembly 34 with a sheath is subjected to a process for reduction of its diameter by a known method to form the wire shown in FIG. 6. When a plurality of the molded products 31 (seven products in FIG. 5) each having the non-oxidizing metal layer formed thereon are assembled as shown in FIG. 5, one of the molded products 31 having the non-oxidizing metal layers 31a thereon is placed at the center, and the other molded products 31 (six) each having the non-oxidizing metal layer 31a are arranged around that molded product 31 at the center. The material used for forming the oxidizing metal tube 33 is properly selected in accordance with the material used for forming each of the non-oxidizing metal layers 31a. For example, when each non-oxidizing metal layer 31a is made of Ag, stainless steel such as 18Cr-8Ni (Japanese Industrial Standard SUS304) or 18Cr-12Ni-2.5Mo (Japanese Industrial Standard SUS316) or a Cu-Ni alloy is used for the oxidizing metal layer 33.

The metal layer 33 of the wire is then covered with a barrier layer (not shown) such as of Ni and Ti, and then with a stabilizing tube 37 made of, for example, oxygen free copper, as shown in FIG. 7, and is subjected to the process of wire drawing to produce a desired diameter followed by heat treatment to produce the oxide superconducting wire 38 shown in FIG. 8. In this case, the stabilizing tube 37 functions to facilitate the process of wire drawing and to stabilize the finally obtained oxide superconducting wire. Examples of materials that may be used for forming the stabilizing tube 37 include known metals with excellent processability such as copper, copper alloys and aluminum. The heat treatment can be performed under such conditions that the temperature is substantially the same as the molded product 31, and the time is substantially the same as that described above. Such wire drawing and heat treatment enable each of the plurality of the molded products 31 to be uniformly reduced in diameter and heated to form a superconducting wire of a small diameter.

Since the thus-obtained oxide superconducting wire 38 contains the non-oxidizing layer 31a which is provided on the outside of each of the superconducting fine wires 31b, the non-oxidizing metal layer 31a ensures that the oxygen in each of the superconducting fine wires 31b is prevented from being robbed by the cylindrical oxidizing metal layer. The oxide superconducting wire 38 is therefore able to maintain the good superconductivity of the superconducting fine wires 31b contained therein and thus to exhibit good superconductivity as a whole.

The thickness of the non-oxidizing layer 21, 25 and 31a should be enough for preventing oxygen from being taken away by the oxidizing metal support from the oxide superconducting material, but is mainly depends on the diameter reducing processing. In the embodiments illustrated, the thickness of the non-oxidizing layer of Ag, before subjected to diameter reducing, is typically larger than about 0.1 mm for the reduction, and the upper limit is determined in view of cost and may be larger than about 5 mm. In the embodiment in FIG. 3, the non-oxidizing layer 21, 25 of Ag has a thickness about 2 mm before it is subjected to diameter reducing.

EXAMPLE 1

A reinforcing core material was prepared by forming a 5 μm thick Ag-plating layer on the surface of a Cu-Ni alloy wire with an external diameter of 5 mm.

A $Y_2O_3$ powder, $BaCO_3$ powder, and CuO powder were mixed so as to have a composition of $YBa_2Cu_3O_7$, and the mixed powder obtained was heated to 700° C. for 3 hours and then calcined by heating at 900° C. for 12 hours. The calcined substance obtained was ground to obtain a powder material. The powder material was charged into a hopper having the same structure as that of the hopper shown in FIG. 1, and the reinforcing core material was led into the four-direction roll so that the powder material was supplied to the periphery of the reinforcing core material and pressed thereon to form a pressed powder layer. The thus-obtained wire was sent to the induction heater in which oxygen was blown at a rate of 500 cc/minute so as to continuously produce a flow of oxygen outside of the pressed powder layer, and the wire was then subjected to a heat treatment at 900° C. for 1.5 hours to form a superconducting layer in the pressed powder layer, a superconducting wire being thereby obtained.

The obtained superconducting wire showed the transition to a superconductive state and a critical current density of 500 A/cm$^2$ when being cooled with liquid nitrogen.

EXAMPLE 2

A wire was prepared from the same materials and by the same method as those employed in Example 1, and then subjected to heat treatment at 900° C. for 1.5 hours under the same conditions as those employed in Example 1. In the course of cooling of the wire to room temperature by allowing it to stand, it was maintained at about 500° C. for about 24 hours to transform the crystal form of the superconducting layer from a cubic system to a rhombic system. The alloy wire used was made of a cu-10 wt % Ni alloy, the particle size of the powder of the calcined substance was about 5 μm, and the thickness of the pressed powder layer was about 2 mm.

The superconducting wire obtained showed a critical temperature of 91 K and a critical current density of 500 A/cm$^2$ at the temperature of liquid nitrogen in a zero magnetic field.

EXAMPLE 3

Powders of $Y_2O_3$, $BaCO_3$ and $CuO$ were mixed in a composition ratio of Y:Ba:Cu:O=1:2:3:7 to form a mixed powder. The mixed powder obtained was then subjected to preliminary calcination at 700° C. for 3 hours and then to temporary calcination at 900° C. for 12 hours. The mixed powder was then ground into a fine particle powder and pressed by a rubber press to obtain a cylindrical molded product having an external diameter of about 10 mm.

The molded product obtained was then inserted into a silver tube having an external diameter of about 15 mm and a wall thickness of 2 mm, and the entire diameter of the product was then reduced to form a wire having an external diameter of about 4 mm.

Seven such wires were prepared, and one of the seven wires was placed at the center while the other six wires were arranged around the wire at the center to form an assembly. The resulting assembly was then inserted into a tube made of 18Cr-8Ni stainless steel (Japanese Industrial Standard SUS304) and having an external diameter of about 14 mm and a wall thickness of 2.5 mm to form a composite assembly. This composite assembly obtained was subjected to a process of wire drawing to reduce its diameter to about 1.5 mm, and then subjected to heat treatment to obtain an oxide superconducting wire of a multi-strand form. This heat treatment was performed at a temperature of 900° C. for 3 hours.

The measured critical temperature of the thus-obtained oxide superconducting wire as about 91° K., and the critical current density was about 500 A/cm$^2$ at the temperature of liquid nitrogen. It was thus found that the oxide superconducting exhibits good superconductivity.

EXAMPLE 4

A multi-strand wire was prepared using the same materials and under the same conditions as those employed in Example 3, and it was also subjected to a process of wire drawing and was then subjected to a heat treatment at 900° C. for 3 hours. In the course of cooling of the prepared wire by allowing it to stand, it was maintained at 500° C. for 24 hours to transform the form of the produced superconducting crystals from a cubic system to a rhombic system. In this example, the particle size of the calcined ground powder was about 5 μm, the hydrostatic pressure of the rubber press in which the calcined ground powder was charged was 2500 kg/cm$^2$, the hardness of the silver tube and the stainless steel tube were Hv=30, 150, respectively, and the thickness of the silver layer provided between the respective strands of superconducting wire was 0.2 mm.

The obtained superconducting wire showed a critical temperature of 89° K. and a critical density of 500 A/cm$^2$ at 77° K. in a zero magnetic field.

What is claimed is:

1. A method for producing an oxide superconducting composite wire, the wire having a superconducting member extending along the wire, an intermediate layer formed on a surface of the superconducting member to prevent oxygen atoms from passing therethrough, and an oxidizing metal support tube surrounding the outer surface of the intermediate layer such that the entire internal surface of the support tube is in contact with the outer surface of the intermediate layer, the method comprising the steps of:

(a) molding a powdered oxide superconductor material to form a wire;
    (b) heat treating the wire in an oxygen atmosphere thereby forming the wire into an oxide superconducting member;
    (c) forming the intermediate layer on a surface of the oxide superconducting member;
    (d) bundling a plurality of the oxide superconducting members containing the intermediate layer;
    (e) inserting the bundled oxide superconducting members into an oxidizing metal support tube; and
    (f) drawing the product of step (e) to reduce its diameter and heat-treating it.

2. A method for producing an oxide superconducting composite wire, the wire having a superconducting member extending along the wire, an intermediate layer formed on a surface of the superconducting member to prevent oxygen atoms from passing therethrough, an oxidizing metal support tube surrounding the outer surface of the intermediate layer such that the entire internal surface of the support tube is in contact with the outer surface of the intermediate layer, and a metal stabilizing tube encapsulating the metal support tube such that the entire internal surface of the stabilizing tube is in contact with the outer surface of the support tube to stabilize the resultant composite wire, the method comprising the steps of:

(a) molding a powdered oxide superconductor material to form a wire;
    (b) heat treating the wire in an oxygen atmosphere thereby forming the wire into an oxide superconducting member;
    (c) forming the intermediate layer on a surface of the oxide superconducting member;
    (d) bundling a plurality of the oxide superconducting members having the intermediate layer;
    (e) inserting the bundled oxide superconducting members into an oxidizing metal support tube; and
    (f) inserting the product of the step (e) into a stabilizing tube; and
    (g) drawing the product of the step (f) to reduce its diameter and heat-treating it.

3. A method for producing an oxide superconducting composite wire, the wire having a superconducting member extending along the wire, an intermediate layer formed on a surface of the superconducting member to prevent oxygen atoms from passing therethrough, an oxidizing metal support tube surrounding the outer surface of the intermediate layer such that the entire internal surface of the support tube is in contact with the outer surface of the intermediate layer, and a metal stabilizing tube encapsulating the support tube such that the entire internal surface of the stabilizing tube is in contact with the outer surface of the support tube to stabilize the resultant composite wire, the method comprising the steps of:

(a) molding a powdered oxide superconductor material to form a wire;
    (b) heat treating the wire in an oxygen atmosphere thereby forming the wire into an oxide superconducting member;

(c) forming the intermediate layer on a surface of the oxide superconducting member;

(d) bundling a plurality of the oxide superconducting members having the intermediate layer;

(e) inserting the bundled oxide superconducting members into an oxidizing metal support tube;

(f) drawing the product of the step (e) to reduce its diameter, to form a composite element assembly;

(g) inserting the composite element assembly into a stabilizing tube; and (h) drawing the product of the step (g) to reduce its diameter and heat-treating it.

4. A method for producing an oxide superconducting composite wire according to any one of claims 2 and 3, wherein the stabilizing tube is made of a copper material.

5. A method for producing an oxide superconducting composite wire according to any one of claim 1, 2 and 3, wherein a plurality of the oxide superconducting members is bundled around one oxide superconducting member.

6. A method for producing an oxide superconducting composite wire according to any one of claim 1, 2 and 3, wherein the powdered oxide superconductor material is compressed by applying hydrostatic pressure of about 1500 to 3500 kg/cm$^2$.

7. A method for producing an oxide superconducting composite wire according to any one of claim 1, 2 and 3, wherein the intermediate layer is formed on the surface of the oxide superconducting member by a method selected from plating, CVD, vapor deposition, sputtering, dipping or cladding.

8. A method for producing an oxide superconducting composite wire according to any one of claim 1, 2 and 3, wherein the heat treating is performed in an oxidizing atmosphere, at a temperature between 700°-1100° C. and for a length of time between about 1 to 300 hours.

9. A method for producing an oxide superconducting composite wire according to claim 8 wherein the heat treatment is performed at said temperature between 1 to 100 hours.

10. A method for producing an oxide superconducting composite wire according to any of claims 1, 2, and 3, wherein the intermediate layer is made of a noble metal material selected from the group consisting of Ag, Au, Pt, Ru, Pd, Rh, Os, Ir, silver alloys and gold alloys.

11. A method for producing an oxide superconducting composite wire according to any one of claim 1, 2 and 3, wherein the powdered oxide superconductor is made of a material selected from the group consisting of Ba and Sr, compounds thereof, alkaline earth metals, compounds thereof, copper oxides and calcined materials thereof.

* * * * *